US011417498B2

(12) United States Patent
Janssen et al.

(10) Patent No.: US 11,417,498 B2
(45) Date of Patent: Aug. 16, 2022

(54) METHOD OF MANUFACTURING A CHARGED PARTICLE DETECTOR

(71) Applicant: FEI Company, Hillsboro, OR (US)

(72) Inventors: Bart Jozef Janssen, Eindhoven (NL); Pleun Dona, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/929,752

(22) Filed: Jul. 15, 2020

(65) Prior Publication Data

US 2021/0020400 A1 Jan. 21, 2021

(30) Foreign Application Priority Data

Jul. 16, 2019 (EP) .................................. 19186447

(51) Int. Cl.
*H01J 37/28* (2006.01)
*H01J 37/244* (2006.01)

(52) U.S. Cl.
CPC ............ *H01J 37/28* (2013.01); *H01J 37/244* (2013.01); *H01J 2237/04756* (2013.01)

(58) Field of Classification Search
CPC .......... H01J 37/28; H01J 37/244; H01J 37/26; H01J 2237/04756; H01J 2237/2447
USPC ......................................... 250/306, 307, 311
See application file for complete search history.

(56) References Cited

U.S. PATENT DOCUMENTS

| 5,512,164 A * | 4/1996 | Timberlake ............. H01J 37/34 205/186 |
| 2011/0169116 A1* | 7/2011 | Nanver ................. H01L 31/105 257/E31.124 |
| 2013/0082241 A1* | 4/2013 | Kub ..................... H01L 31/0336 257/21 |
| 2015/0225876 A1* | 8/2015 | Yonehara ................ C30B 33/00 156/754 |

(Continued)

FOREIGN PATENT DOCUMENTS

WO 2004/099740 11/2004

OTHER PUBLICATIONS

Deptuch et al, Tritium autoradiography with thinned and back-side illuminated monolithic active pixel sensor device, Nuclear instruments & methods in physics research, May 11, 2005, pp. 537-548, vol. 543, No. 2-3, Elsevier BV, Amsterdam, Netherlands.

(Continued)

*Primary Examiner* — Jason L McCormack

(57) ABSTRACT

The invention relates to a method of manufacturing a charged particle detector, comprising the steps of providing a sensor device, such as an Active Pixel Sensor (APS). Said sensor device at least comprises a substrate layer and a sensitive layer. The method further comprises the step of providing a mechanical supporting layer and connecting said mechanical supporting layer to said sensor device. After connection, the sensitive layer is situated in between said substrate layer and said mechanical supporting layer. By connecting the mechanical supporting layer, it is possible to thin said substrate layer for forming said charged particle (Continued)

detector. The mechanical supporting layer forms part of the manufactured detector. The detector can be used in a charged particle microscope, such as a Transmission Electron Microscope for direct electron detection.

20 Claims, 5 Drawing Sheets

(56) References Cited

U.S. PATENT DOCUMENTS

2019/0280042 A1* 9/2019 Von Kanel ............ H01J 37/244

OTHER PUBLICATIONS

Deptuch et al, Direct electronic imaging in electron microscopy with monolithic active pixel sensors, Ultramicroscopy, Apr. 21, 2007, pp. 674-684, vol. 107, No. 8, Elsevier BV, Amsterdam, Netherlands.

Marco Battaglia et al, A Study of Monolithic CMOS Pixel Sensors Back-thinning and their Application for a Pixel Beam Telescope, ARXIV.org, Cornell University Library, Nov. 8, 2006, Ithaca, NY.

Koziel Michal et al, Vacuum-compatible ultra-low material budget Micro-Vertex Detector of the compressed baryonic matter experiment as FAIR, Nuclear Instruments & Methods in Physics Research, Section A, Jan. 1, 2017, pp. 110-113, vol. 845, Elsevier BV, Amsterdam, Netherlands.

Battaglia Marco et al, R & D Paths of pixel detectors for vertex tracking and radiation imaging, Nuclear Instruments & Methods in Physics Research, Section A, Mar. 30, 2013, pp. 29-45, vol. 716, Elsevier BV, Amsterdam, Netherlands.

Matheson J et al, Characterisation of a monolithic active pixel sensor for electron detection in the energy range 10-20 keV, Nuclear Instruments & Methods in Physics Research, Section A, Sep. 1, 2009, pp. 199-205, vol. 608, No. 1, Elsevier BV, Amsterdam, Netherlands.

Dulinski W et al, Tests of a backside illuminated monolithic CMOS pixel sensor in an HPD set-up, Nuclear Methods in Physics Research, Section A, Jul. 1, 2005, pp. 274-280, vol. 546, No. 1-2, Elsevier BV, Amsterdam, Netherlands.

Xiaoping Zha et al, Direct Detection of Low-Energy Electrons with a Novel CMOS APS Sensor, IEEE Transactions on Electron Devices IEEE Service Center, Dec. 1, 2012, pp. 3594-3600, vol. 59, No. 12, Pisacataway, NJ, USA.

* cited by examiner

METHOD OF MANUFACTURING A CHARGED PARTICLE DETECTOR

BACKGROUND OF THE INVENTION

The present invention relates to a method of manufacturing a charged particle detector, wherein said charged particle detector comprises a sensor device having a substrate layer and a sensitive layer.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

In a SEM, irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

In TEM, a beam of electrons is transmitted through a specimen to form an image from the interaction of the electrons with the sample as the beam is transmitted through the specimen. The image is then magnified and focused onto an imaging device, such as a fluorescent screen, a layer of photographic film, or a sensor such as a scintillator attached to a charge-coupled device (CCD). The scintillator converts primary electrons in the microscope to photons so that the CCD is able to detect it.

A more recent development in TEMs includes the use of direct electron detectors. These direct electron detectors are able to directly detect image-forming electrons in the microscope without the use of a scintillator. The direct electron detector is based on sensor technology in which electrons directly impinge on a lightly doped silicon epilayer supported on a more highly doped silicon substrate. A passivation layer is provided on top of the epilayer and comprises heavily doped wells and the electronics and interconnects for the readout. With the direct electron detector of this kind, already an improved resolution, signal-to-noise (SNR) ratio, and sensitivity can be obtained (McMullan, Faruqi, & Henderson, 2016). This favorable SNR ratio, coupled with high speed CMOS electronics, enables counting of individual primary electrons.

SUMMARY OF THE INVENTION

It is an object to provide an improved charged particle detector, in particular an improved direct electron detector, and a method for manufacturing such a detector.

To this end, a method of manufacturing a charged particle detector as defined in claim 1 is provided. The method as defined herein comprises the steps of providing a sensor device, such as an active pixel sensor (APS), wherein said sensor device comprises a substrate layer and a sensitive layer. The sensor device with the sensitive layer is capable of detecting incoming charged particles, and in particular arranged for detecting incoming electrons. The substrate layer can be the highly doped silicon substrate, for example. The sensitive layer may include an epilayer. The sensor device, such as an APS, may comprise a passivation layer on top of said sensitive layer as well. The sensitive layer may in that case be sandwiched between said passivation layer and said substrate layer. The passivation layer may include heavily doped wells and the electronics and interconnects for the readout.

According to the method as defined herein, the method comprises the step of providing a mechanical supporting layer and connecting said mechanical supporting layer to said sensor device in such a way that the sensitive layer is situated in between said substrate layer and said mechanical supporting layer. The mechanical supporting layer may be provided in such a way that the sensitive layer is directly adjacent to said mechanical supporting layer. In other embodiments where the sensor device, such as an APS, comprises the passivation layer, the passivation layer is situated in between the sensitive layer and the mechanical supporting layer.

According to the method as defined herein, the method comprises the subsequent step of thinning said substrate layer for forming said charged particle detector.

Providing said mechanical supporting layer and connecting it to the sensor device, enables easy thinning of the substrate layer. The mechanical supporting layer provides a mechanical support during the thinning process. Due to the use of the mechanical supporting layer, the charged particle detector is less fragile during the thinning process. Additionally, the mechanical supporting layer allows a substantial part of the substrate layer to be removed. In an embodiment, it becomes possible to remove the substrate layer completely. In other words, the mechanical supporting layer allows the charged particle detector to be back-thinned up to the epilayer. By having such a back-thinned detector, noise contribution from scattered electrons is reduced.

In an advantageous embodiment, said mechanical supporting layer remains on said charged particle detector after manufacturing. In other words, the mechanical supporting layer is connected to said sensor device in a permanent manner and is not removed to finalize the manufacturing process. The connection between the mechanical supporting layer and the sensor device may be designed in such a way that the permanent connection is maintained or enhanced. By making the mechanical supporting layer a part of the final charged particle detector, the speed of the manufacturing process is improved, and the strength and durability of the charged particle detector is improved as well.

It is noted that in principle the use of thinner sensors is advantageous, and hence the addition of a mechanical supporting layer that remains attached—making the charged particle sensor thicker—seems counter-intuitive. Inventors found however that by attaching the mechanical supporting layer to the sensor device and thinning the substrate layer up to the sensing layer, it becomes possible to use the manufactured charged particle detector in so-called back-side illumination mode. In back-side illumination, the sensing layer is the outermost layer of the charged particle detector. The sensing layer can be arranged to face the expected incoming stream of charged particles, and the mechanical supporting layer is positioned on a backside of the sensing layer and already reduces the effect of scattering. Hence, the application of the mechanical supporting layer, and the maintenance of this layer in the final charged particle detector, is not really a disadvantage as the disadvantageous effects are small enough to compensate for the advantages it offers.

Maintenance of the mechanical supporting layer is advantageous as well in case the sensor device comprises a sensing layer and a passivation layer containing heavily doped wells and the electronics and interconnects for the readout. In this case, the epilayer of the sensing layer faces the (expected) incoming stream of charged particles, such as electrons. The mechanical supporting layer is directed away from the incoming stream of charged particles, and the passivation layer is sandwiched in between the mechanical supporting layer and the sensing layer. The passivation layer is mechanically protected by the two surrounding layers. Detection of charged particles can take place in a more direct manner as well, since the passivation layer isn't the first layer that is hit by incoming charged particles, which could lead to scattering and other effects that are undesirable.

To prevent the mechanical supporting layer from influencing the signal detected by the charged particle detector, such as can occur for example due to backscattered electrons originating from the mechanical supporting layer, the mechanical supporting layer comprises, in an embodiment, a low-Z material. Such a low-Z material may include materials comprising carbon, beryllium, and/or boron, for example. The low-Z material may include other materials as well. For example, the low-Z material may contain polymers, such as polyethylene (PE), polystyrene (PS), polypropylene (PP) and polycarbonate (PC), as well. Other low-Z materials are conceivable as well.

In advantageous embodiments, the mechanical supporting layer comprises a heat conducting material. The direct electron detectors for use in charged particle microscopes typically operate in vacuum and need to dissipate about 0.2-20 W of thermal power. It is known that heat transfer in vacuum is a challenge. The amount of power typically also increases as the frame-rate increases. In an embodiment, the sensor device may be back-thinned to a thickness of approximately 20-40 µm. In case the sensor device is back-thinned to these dimensions, the cross-sectional area becomes smaller and hence heat flux due to thermal conduction decreases as well. In effect, this leads to cooling being a major challenge for these back-thinned detectors. To this end, the mechanical supporting layer may in an embodiment comprise a heat conducting material, or may be made of a heat conducting material, that is arranged for transferring (by means of conduction, e.g.) said 0.2-20 W of thermal power away to a heat sink, for example, or at least evenly distribute the thermal power to prevent hot spots. Said heat conducting material may have a heat conductivity of at least 500 W/m K, and in particular of at least 1000 W/m K. The thickness of the mechanical supporting layer may be similar to the thickness of the back-thinned layer, such as for example in the range of 10-50 µm, in particular approximately 25 µm. The connection to the sensor device and the properties of the mechanical supporting layer are such that the mechanical supporting layer is capable of transferring the aforementioned thermal power via conduction. The charged particle detector may comprise a heat sink connected to said mechanical supporting layer, and arranged for active cooling, using water cooling and/or Peltier cooling, for example.

In an advantageous embodiment, the mechanical supporting layer comprises a low-Z, heat conducting material. In an embodiment, use is made of carbon materials such as graphite and carbon fiber composites. In an embodiment pyrolytic carbon is used. In addition to support it also offers excellent heat conductivity (~1950 W/m K) and has very low mass (low Z). This allows for excellent heat transfer away from the detector towards a heat sink, and minimizes the amount of (unwanted) scattering of electrons. It is noted in this regard that the pyrolytic carbon provides an improvement in heat conductivity over currently used materials as well. Additionally, pyrolytic carbon is a vacuum compatible material as well, which allows the use of the obtained charged particle detectors in charged particle microscopes. The thickness of the mechanical supporting layer may be in the range of approximately 10 to 50 µm, such as approximately 25 µm.

To allow the mechanical supporting layer to act as a heat conducting material, it is advantageous when the mechanical supporting layer is in good thermal contact with the sensor device. To this end, the method may comprise the step of connecting said mechanical supporting layer to said sensor device by means of an adhesive. Said adhesive may in principle be of any type, such as non-reactive (e.g. solvent-based adhesives; permanent or non-permanent pressure-sensitive adhesives; contact adhesive; hot adhesives) or reactive (anaerobic adhesives; multi-part adhesives; premixed and frozen adhesives; one-part adhesives). In an advantageous embodiment, a liquid or flowable adhesive is used. By using such an adhesive it is possible to ensure a good thermal contact between the sensor device and the mechanical supporting layer to be established. Using an adhesive that is capable of adapting itself to any non-flat surface (such as occurring at the APS, for example) will help in providing a good thermal contact, but will also increase the structural strength of the final direct electron detector.

In an embodiment, the mechanical supporting layer is directly connected to at least part of said sensitive layer. In other embodiments, when said sensor device comprises a passivation layer, said mechanical supporting layer is directly connected to said passivation layer. A direct connection includes a direct connection wherein use is made of an adhesive. Said adhesive may have a certain thickness, and resides between the mechanical supporting layer and the layer to which the mechanical layer is directly connected. A direct connection to the relevant layer keeps the sensor relatively compact, but aids in heat dissipation as well.

According to an aspect, a charged particle detector is provided, comprising: a sensor device, such as an APS, having a sensitive layer and a passivation layer; and a mechanical supporting layer connected to said sensor device in such a way that the passivation layer is situated in between said sensitive layer and said mechanical supporting layer.

The sensor device of the charged particle detector may consist of the sensitive layer and the passivation layer. The sensitive layer may comprise, or consist of, a lightly doped silicon epilayer. The passivation layer may be connected to the epilayer. The passivation layer may comprise the heavily doped wells and the electronics and interconnects for the readout. The sensor device may be free from any substrate layer, and in particular free from a more highly doped silicon substrate. The sensor device may be based on Active Pixel Sensor (APS) technology, such as Monolithic Active Pixel Sensor (MAPS) technology. The sensitive layer, and in particular the epilayer, may form an outermost layer of the charged particle detector. By making the sensitive layer, e.g. the epilayer, the outermost layer of the charged particle detector, a detector with improved noise characteristics is obtained. The mechanical supporting layer aids in the robustness of the charged particle detector and may—as explained before—help in providing sufficient heat transfer from the charged particle detector to the surroundings, or at least distribute it more evenly over the sensor device.

The charged particle detector of this kind exhibits improved resolution, signal-to-noise ratio, and sensitivity and is in particular useful as direct electron detector in TEMs or charged particle microscopes in general, and even more so in case of electron counting.

The charged particle detector may have a total thickness in the range of approximately 30-100 μm, more in particular in the range of 40-60 μm. The mechanical supporting layer may have a thickness that is similar to the thickness of the sensor device. The mechanical supporting layer may have a thickness of approximately 10 to 50 μm, such as approximately 25 μm, for example.

As described before, the mechanical supporting layer may in an embodiment be made of a heat conducting, low Z material. Said mechanical supporting layer may comprise carbon, in particular pyrolytic carbon. In an embodiment, the mechanical supporting layer consists of pyrolytic carbon.

The charged particle detector may comprise an adhesive layer, or glue layer, in between said mechanical supporting layer and said passivation layer. The adhesive layer ensures a good thermal connection between the sensor device and the mechanical supporting layer. Additionally, the adhesive layer may aid in establishing an electrically isolating layer between the passivation layer and the mechanical supporting layer.

According to an alternative aspect, a charged particle detector is provided, comprising: a sensor device, such as an APS, having a sensitive layer and a passivation layer; and a mechanical supporting layer connected to said sensor device in such a way that the sensitive layer is situated in between said passivation layer and said mechanical supporting layer. The charged particle detector according to this embodiment is in particular advantageous in view of heat transfer. The mechanical supporting layer may in an embodiment be made of a heat conducting, low Z material. Said mechanical supporting layer may comprise carbon, in particular pyrolytic carbon. In an embodiment, the mechanical supporting layer consists of pyrolytic carbon. These features may be used to improve scattering performance of the charged particle detector.

According to an aspect, a charged particle microscope for examining a specimen, comprises: an optics column, including a charged particle source and an illuminator for directing a beam of charged particles emitted from said charged particle source onto a specimen; a specimen stage positioned downstream of said illuminator and arranged for holding said specimen; a detector device for detecting emissions originating from said specimen in response to the incidence of charged particles emitted from said charged particle source; and a control unit for performing operations of the charged particle microscope.

The charged particle microscope as defined herein comprises a charged particle detector as described herein, such as the charged particle detector as defined in claim 11.

The charged particle microscope may, in an embodiment, be a TEM. The charged particle detector may be a direct electron detector. The charged particle detector is, in an embodiment, placed in such a way that said sensitive layer is positioned in between said particle source and said mechanical supporting layer. In other words, the sensitive layer is facing said particle source directly. The passivation layer is located in between said sensitive layer and said mechanical supporting layer.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings.

DETAILED DESCRIPTION OF EMBODIMENTS

Figure 1:
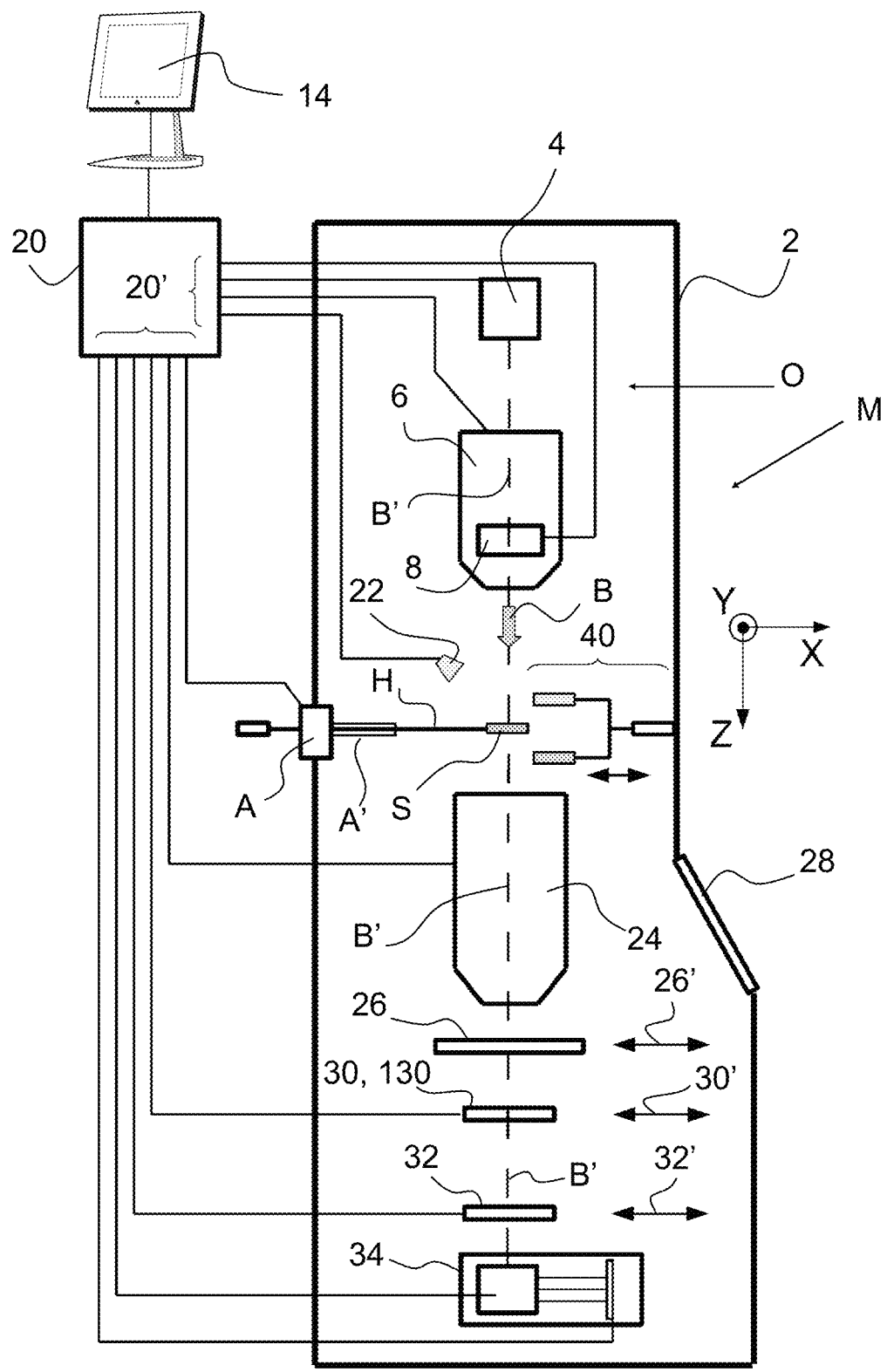
FIG. 1 shows a longitudinal cross-sectional view of a charged particle microscope according to a first embodiment of the invention.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/ magnetic lenses, deflectors, correctors (such as stigmators), etc. In normal (non-scanning) TEM mode, this imaging system 24 can focus the transmitted electron flux onto a fluorescent screen 26, which, if desired, can be retracted/ withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as: a TEM camera 30 or a STEM camera 32. Where the camera is a TEM camera 30, the electron flux can form a static image (or diffractogram) that can be processed by controller/processor 20 and displayed on a display device 14, such as a flat panel display, for example. When not required, camera 30 can be retracted/ withdrawn (as schematically indicated by arrows 30') so as to get it out of the way of axis B'.

Where the camera is a STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example. It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M as shown in FIG. 1 thus generally comprises: an optics column O, including a charged particle source 4 and an illuminator 6 for directing a beam B of charged particles emitted from said charged particle 4 source onto a specimen S; a specimen stage A, H positioned downstream of said illuminator 6 and arranged for holding said specimen S; one or more detector devices 22, 26, 30, 32, 34 for detecting emissions originating from said specimen in response to the incidence of charged particles emitted from said charged particle source; and a control unit for performing operations of the charged particle microscope.

The charged particle microscope M of FIG. 1 also comprises a charged particle detector 130 as defined herein. The charged particle detector 130 as defined herein is in particular useful as a direct electron detector. The charged particle detector 130 may be used as the TEM camera 30 of FIG. 1. Full details of embodiments of the charged particle detector 130 will be explained by means of FIG. 3.

Figure 2:
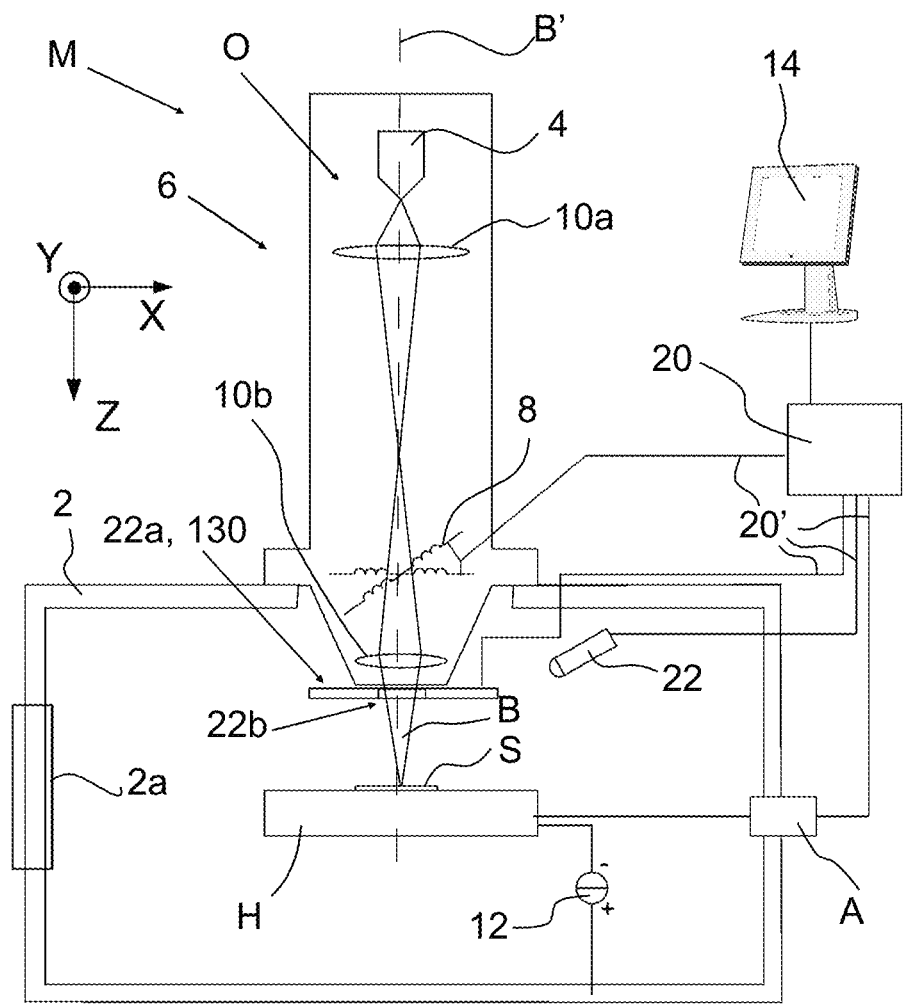
FIG. 2 shows a longitudinal cross-sectional view of a charged particle microscope according to a second embodiment of the invention.

Now first referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts: 2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired; 10a, 10b: Schematically depicted lenses/optical elements in illuminator 6; 12: A voltage source, allowing the specimen holder H, or at least the specimen S, to be biased (floated) to an electrical potential with respect to ground, if desired; 14: A display, such as a FPD or CRT; 22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Thus the charged particle microscope M as shown in FIG. 2 generally comprises: an optics column O, including a charged particle source 4 and an illuminator 6 for directing a beam B of charged particles emitted from said charged particle 4 source onto a specimen S; a specimen stage A, H positioned downstream of said illuminator 6 and arranged for holding said specimen S; one or more detector devices 22, 26, 30, 32, 34 for detecting emissions originating from said specimen in response to the incidence of charged particles emitted from said charged particle source; and a control unit for performing operations of the charged particle microscope.

The charged particle microscope M of FIG. 2 additionally comprises a scanner 8, for focusing a beam B of charged particles emitted from said charged particle source 4 onto a specimen S.

The charged particle microscope M of FIG. 2 also comprises a charged particle detector 130 as defined herein. The charged particle detector 230 as defined herein is in particular useful as a direct electron detector. The charged particle detector 130 may be used as the segmented electron detector 22a, providing—in effect—a pixelated segmented electron detector 22a. Full details of embodiments of the charged particle detector 130 will be explained by means of FIG. 3.

Now referring to FIG. 3a and FIG. 3b, embodiments of the charged particle detector 130 as defined herein will be discussed. The charged particle detector 130 comprises a sensor device 120, such as an Active Pixel Sensor, or Monolithic Active Pixel Sensor. Said sensor device 120 comprises a sensitive layer 140 and a passivation layer 150. The sensitive layer 140 comprises an epilayer 141 and the passivation layer 150 contains a sub-layer of heavily doped wells 152;155;156 and a further sub-layer 151 for insulation and passivation. The sub-layer 151 may include an oxide and metal layer. The heavily doped wells 152;155;156 may include P-wells 152 and N-wells 156, 156, wherein the N-wells are used to detect electrons generated in the epilayer due to an incoming electron 101. The pixel spacing of the charged particle detector 130 is determined by the spacing between diodes formed by the well doped areas (N-wells 155, 156). The track of an incident electron 101, and diffusive collection of mobile electrons generated in electron-hole pair excitations by N-well 156 is schematically indicated.

It is noted that the basic construction of such an Active Pixel Sensor containing an epilayer, a layer of heavily doped wells and a layer for insulation and passivation is known per se to those skilled in the art. It is further noted that the structure of such an Active Pixel Sensor may differ in some embodiments. Generally speaking though, the sensor device 120 comprises a sensitive layer 140 and a passivation layer 150.

Figure 3A:
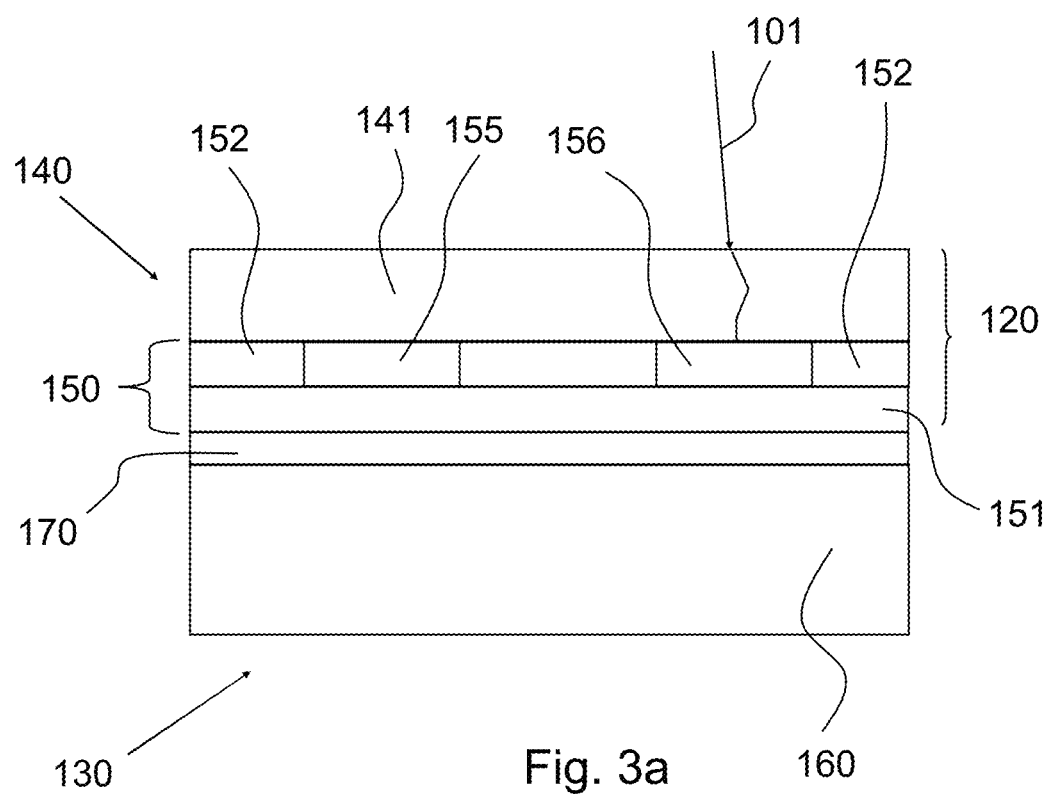
FIGS. 3a-b show embodiments of charged particle detectors as disclosed herein.
Figure 3B:
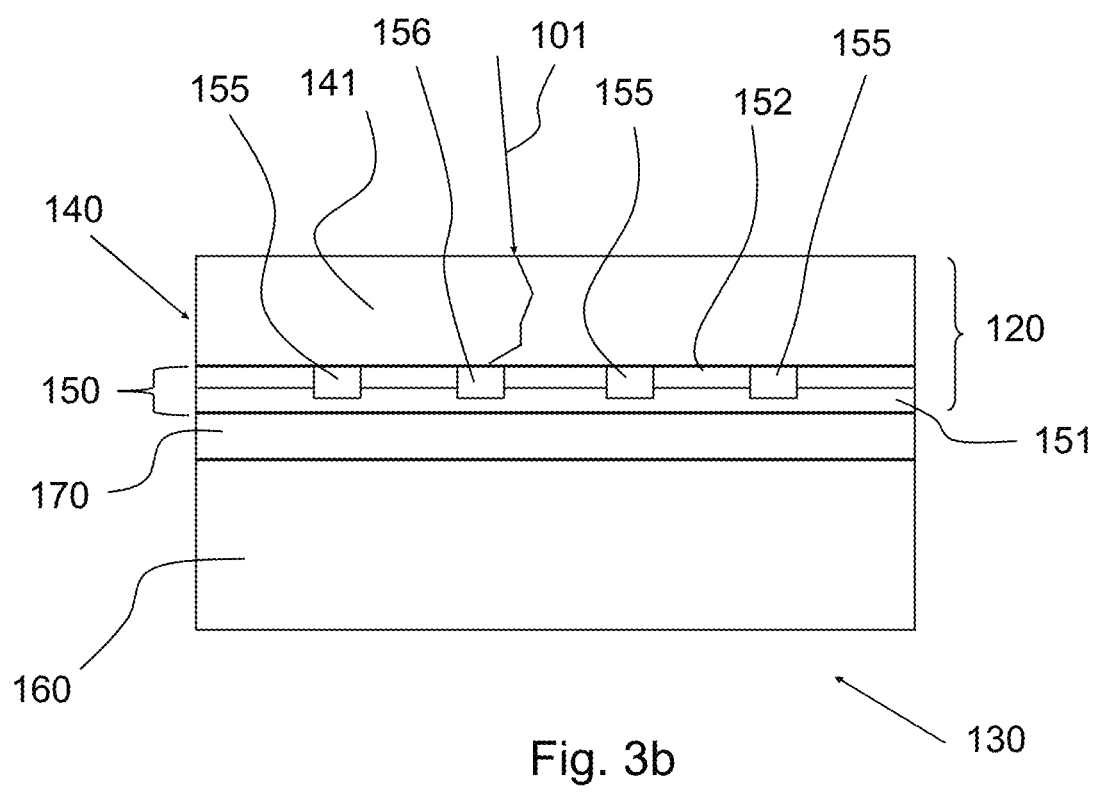

According to the present disclosure, and as shown in FIGS. 3a and 3b, the charged particle detector 130 comprises a mechanical supporting layer 160 connected to said sensor device 120 in such a way that the passivation layer 150 is situated in between said sensitive layer 150 and said mechanical supporting layer 160. As indicated before, the mechanical supporting layer provides a mechanical support for the charged particle detector 130, and allows the sensitive layer to be very thin, enabling accurate detection of incoming electrons 101. Due to the presence of the mechanical supporting layer 160, the total thickness of the charged particle detector can be in the order of 10 to 100 µm, such as 50 µm, for example. In an embodiment, the sensor device 120 has a thickness of approximately 30 µm, and the mechanical supporting layer has a thickness of approximately 25 µm. The mechanical supporting layer 160 is connected to the sensor device 120 by means of a layer of glue 170. The thickness of the glue may be approximately 5 µm. This yields a total thickness for the charged particle detector 130 of approximately 60 µm. Other dimensions are conceivable of course.

The mechanical supporting layer 160 may comprises a low-Z, heat conducting material, which may comprise carbon materials such as graphite and carbon fiber composites. In an embodiment pyrolytic carbon is used. In addition to support it also offers excellent heat conductivity (~1950 W/m K) and has very low mass (low Z). This allows for excellent cooling of the detector and minimizes the amount of (unwanted) scattering of electrons.

Figure 4A:
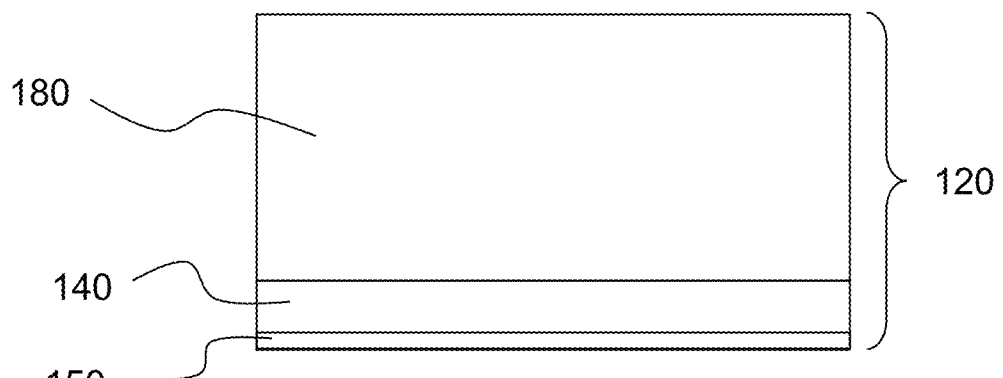
FIGS. 4a-c show an embodiment of a method for manufacturing a charged particle detector as disclosed herein.
Figure 4B:
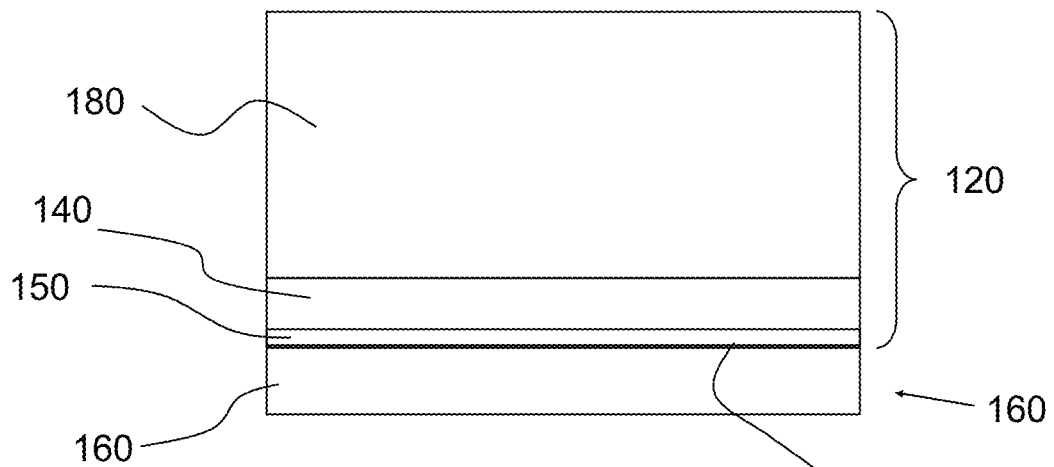
Figure 4C:
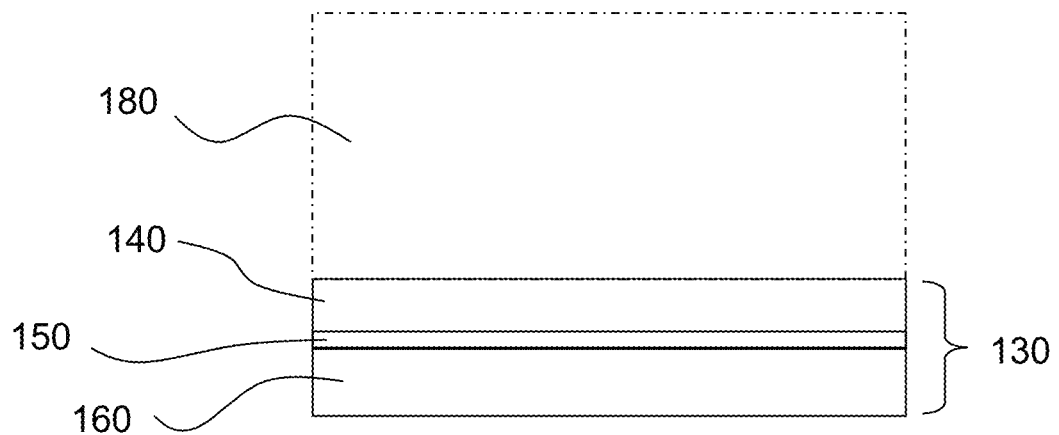

FIG. 4a-4c show an embodiment of a method of manufacturing the charged particle detector 130 of FIGS. 3a and 3b. The method shown comprises the subsequent steps of: 1) providing, as shown in FIG. 4a, a sensor device 120, wherein said sensor device 120 comprises a substrate layer 180, and a sensitive layer 140; 2) providing, as shown in FIG. 4b, a mechanical supporting layer 160 and connecting said mechanical supporting layer 160 to said sensor device 120 in such a way that the sensitive layer 140 is situated in between said substrate layer 180 and said mechanical supporting layer 160; and 3) thinning, as schematically shown in FIG. 4c, said substrate layer 180 for forming said charged particle detector 130.

The use of the mechanical supporting layer 160 allows easy and heavy back-thinning of the substrate layer 180, up to the sensitive layer (e.g. up to the epilayer thereof). In other words, the substrate layer 180 may be completely removed. This allows the obtained charged particle detector to be used in so-called back-illumination mode, wherein the epilayer is facing the (expected) incoming charged particles, such as electrons, and the passivation layer is (partly) shielded from these incoming charged particles by the epilayer. This results in improved detector properties.

In embodiments, and as shown in FIG. 4b, an adhesive 170 is used for connecting said mechanical supporting layer 160 to said sensor device 120. This may include the application of the adhesive to one or more of the sensor device 120 and the supporting layer 160. In particular, the entire surface of the sensor device 120 and/or the supporting layer 160 may be covered with the adhesive. This ensures that irregularities in the surfaces are filled with the adhesive, to ensure good thermal contact between the sensor device 120 and the mechanical supporting layer 160.

As shown in FIG. 4a-4c, said sensor device 120 may comprise a passivation layer 150. As indicated before, the passivation layer 150 comprises heavily doped wells and the electronics and interconnects for the readout of signals induced by incoming electrons in the sensitive layer 140. The passivation layer 150 may comprise an isolating (metal-oxide) layer as well. The mechanical supporting layer 160 is connected to said passivation layer 150, but still the sensitive layer 140 is situated in between the substrate layer 180 and the mechanical supporting layer 160.

The sensor device provided in step 1), and as shown in FIG. 4a, may be an Active Pixel Sensor (APS), such as a Monolithic Active Pixel Sensor (MAPS).

Figure 5:
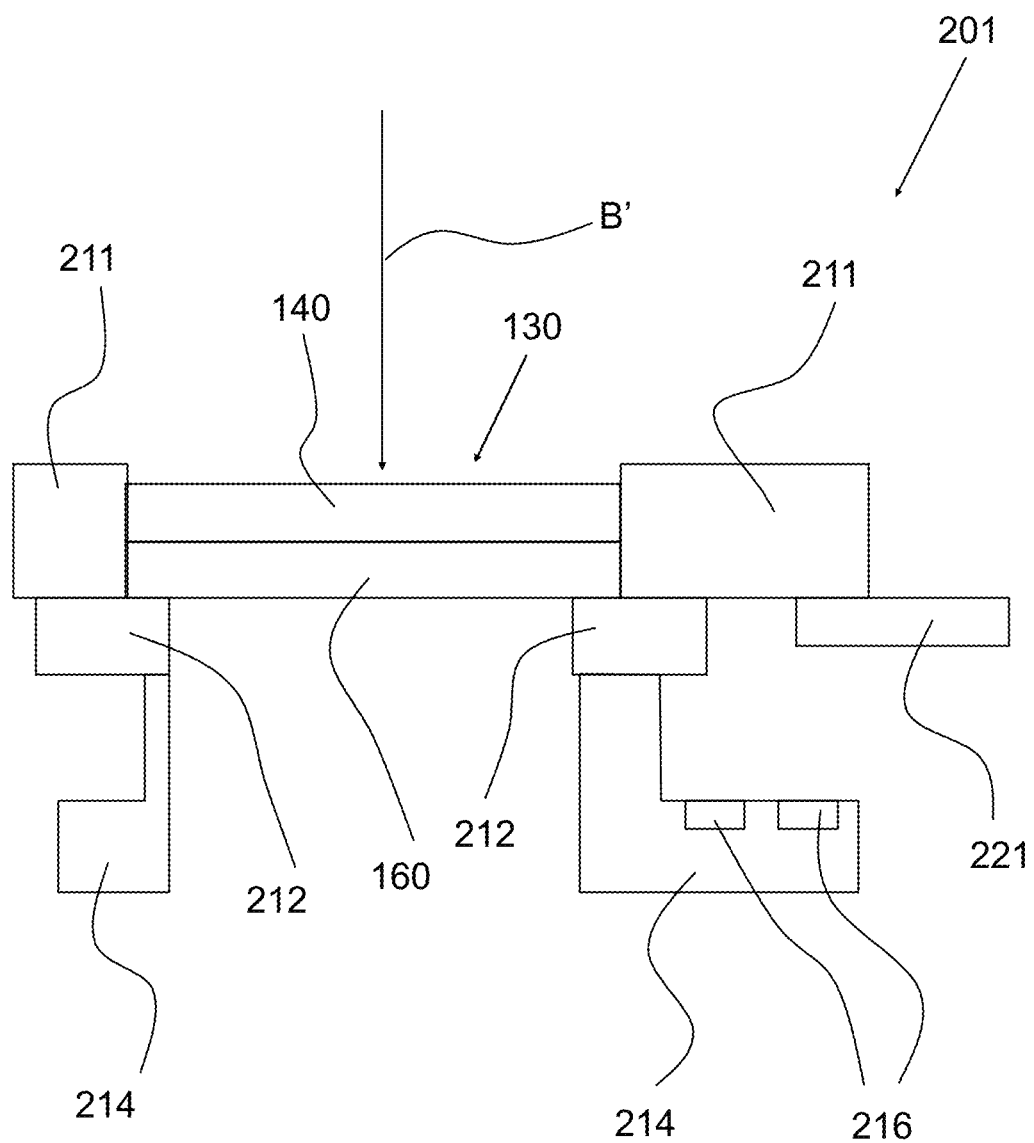
FIG. 5 shows the use of a charged particle detector in a charged particle microscope.

Now turning to FIG. 5, an embodiment of a detector unit 201 including the charged particle detector 130 as described herein is shown. The charged particle detector 130 has, as generally indicated, the sensitive layer 140 and the mechanical supporting layer 160. The sensitive layer 140 is facing the incoming stream of charged particles B'. The mechanical supporting layer 160 is provided downstream of the charged particle beam B'.

The detector unit 201 further comprises a sensor PCB 211 and a feedthrough PCB 221, for providing an I/O connection for the charged particle detector 130 to controller 20. The assembly of the sensor PCB 211 and the charged particle detector 130 is supported by carrier elements 212. The carrier elements 212 are connected to cooling device 214 that contains Peltier cooling elements 216 for cooling the charged particle device in use thereof. The use of pyrolytic carbon provides improved heat transfer characteristics, so that the power generated during use of the device can be dissipated.

The desired protection is conferred by the appended claims.

CITED REFERENCES

[1] McMullan, G & Faruqi, A.R. & Henderson, Richard. (2016). Direct Electron Detectors. 10.1016/bs.mie.2016.05.056.

What is claimed is:

1. A method of manufacturing a charged particle detector, comprising the steps of:
   providing a sensor device, wherein said sensor device comprises a substrate layer, and a sensitive layer, the sensor layer having a first surface which faces the substrate layer and a second surface that is opposite the first surface;
   providing a mechanical supporting layer and connecting said mechanical supporting layer to said sensor device in such a way that the sensitive layer is situated in between said substrate layer and said mechanical supporting layer, wherein the mechanical supporting layer is provided so that the second surface of the sensor layer faces the mechanical supporting layer;
   thinning said substrate layer to expose the first surface of the sensitive layer to form said charged particle detector where the first surface of the sensitive layer is able to receive incoming charged particles.

2. A method according to claim 1, comprising the step of using an adhesive for connecting said mechanical supporting layer to said sensor device.

3. A method according to claim 1, comprising the step of connecting said mechanical supporting layer directly to said sensitive layer.

4. A method according to claim 1, wherein the sensor device comprises a passivation layer on top of said sensitive layer.

5. A method according to claim 4, comprising the step of connecting said mechanical supporting layer to said passivation layer.

6. A method according to claim 1, wherein said mechanical supporting layer comprises a low-Z material.

7. A method according to claim 1, wherein said mechanical supporting layer comprises a heat conductor.

8. A method according to claim 7, wherein said mechanical supporting layer comprises a heat conducting, low-Z material.

9. A method according to claim 8, wherein said mechanical supporting layer comprises pyrolytic carbon.

10. A method according to claim 1, wherein said sensor device is an active pixel sensor (APS).

11. A charged particle detector, comprising:
    a sensor device having a sensitive layer and a passivation layer, the sensitive layer having a first surface which faces the passivation layer and a second surface that is opposite the first surface;
    a mechanical supporting layer connected to said sensor device in such a way that the passivation layer is situated in between said sensitive layer and said mechanical supporting layer, wherein the mechanical supporting layer is provided so that the first surface of the sensitive layer faces the mechanical supporting layer; and
    wherein the charged particle detector is formed at least in part by thinning a substrate to expose the second surface of the sensitive layer such that the second surface of the sensitive layer is able to receive incoming particles.

12. A charged particle detector according to claim 11, wherein said mechanical supporting layer is made of a heat conducting, low Z material.

13. A charged particle detector according to claim 12, wherein said mechanical supporting layer comprises carbon.

14. A charged particle detector according to claim 11, wherein said charged particle detector comprises an adhesive layer in between said mechanical supporting layer and said passivation layer.

15. A charged particle detector according to claim 11, wherein said sensor device is an active pixel sensor (APS).

16. A charged particle microscope for examining a specimen, comprising:
    an optics column, including a charged particle source and an illuminator for directing a beam of charged particles emitted from said charged particle source onto a specimen;
    a specimen stage positioned downstream of said illuminator and arranged for holding said specimen; and
    a detector device for detecting emissions originating from said specimen in response to the incidence of charged particles emitted from said charged particle source, the detector device comprising:
    a sensor device having a sensitive layer and a passivation layer, the sensitive layer having a first surface which faces the passivation layer and a second surface that is opposite the first surface; and
    a mechanical supporting layer connected to said sensor device in such a way that the passivation layer is situated in between said sensitive layer and said mechanical supporting layer, wherein the mechanical supporting layer is provided so that the first surface of the sensitive layer faces the mechanical supporting layer; and
    wherein the charged particle detector is formed at least in part by thinning a substrate to expose the second surface of the sensitive layer such that the second surface of the sensitive layer is able to receive incoming particles.

17. The charged particle microscope according to claim 16, wherein said charged particle detector is placed in such a way that said sensitive layer is positioned in between said particle source and said mechanical supporting layer.

18. The charged particle microscope according to claim 16, wherein said mechanical supporting layer is made of a heat conducting, low Z material.

19. The charged particle microscope according to claim 18, wherein said mechanical supporting layer comprises carbon.

20. The charged particle microscope according to claim 16, wherein said charged particle detector comprises an adhesive layer in between said mechanical supporting layer and said passivation layer.

* * * * *